United States Patent [19]

Huenger et al.

[11] Patent Number: 5,256,441

[45] Date of Patent: Oct. 26, 1993

[54] DUCTILE COPPER

[75] Inventors: Eric C. Huenger, Seaford; Stanley W. Tarry, Kings Park, both of N.Y.; Richard A. Mayernik, Newark, Del.

[73] Assignee: AMP-AKZO Corporation, Newark, Del.

[21] Appl. No.: 924,846

[22] Filed: Aug. 4, 1992

[51] Int. Cl.⁵ .............................................. C23C 26/00
[52] U.S. Cl. ...................................... 427/8; 427/305; 427/437; 427/443.1
[58] Field of Search .................. 427/8, 437, 443.1, 305

[56] References Cited

U.S. PATENT DOCUMENTS

| | | | |
|---|---|---|---|
| 3,147,154 | 9/1964 | Cole | 427/437 |
| 3,310,430 | 3/1967 | Schneble et al. | 428/457 |
| 3,485,643 | 12/1969 | Zeblisky | 427/305 |
| 3,615,722 | 10/1971 | Kurtz | 426/471 |
| 3,615,732 | 10/1971 | Shipley | 106/1.23 |
| 3,615,735 | 10/1971 | Shipley | 106/1.22 |
| 3,959,351 | 5/1976 | Day | 562/840 |
| 4,248,633 | 2/1981 | Heijnen | 427/437 |
| 4,563,217 | 1/1986 | Kikuchi et al. | 106/1.23 |
| 4,632,852 | 12/1986 | Akahoshi | 427/443.1 |
| 4,650,691 | 3/1987 | Kinoshita | 427/437 |
| 4,695,505 | 9/1987 | Dutkewych | 106/1.23 |
| 4,865,888 | 9/1989 | Akahoshi et al. | 427/443.1 |
| 4,970,107 | 11/1990 | Akahoshi | 428/209 |

FOREIGN PATENT DOCUMENTS 2083080 3/1982 United Kingdom ................ 427/437

OTHER PUBLICATIONS

Standard Specification IPC-AM-372, "Electroless Copper Film for Additive Printed Boards," The Institute for Interconnecting and Packaging Electronic Circuits, Lincolnwood, Ill. (1978).

Japanese Industrial Standard JIS H 8646, "Electroless Copper Platings," Japanese Standards Association, Tokyo, Japan (1991).

Primary Examiner—Shrive Beck
Assistant Examiner—Vi Duong Dang
Attorney, Agent, or Firm—Morgan & Finnegan

[57] ABSTRACT

An improved method of manufacturing electrolessly deposited copper is described. The copper deposits ar useful in the manufacture of fully additive and partly additive plated-through hole, printed wiring boards. The copper is deposited from a bath containing a copper compound, a complexing agent for copper, a reducing agent for copper, a pH-adjusting agent and one or more addition agents. The improvement for producing highly stress resistant, copper deposits comprises controlling one or more plating bath parameters such as pH, complexing agents and sources of iron or chromium, so that the trace iron and/or chromium in the deposited copper is less than 2 mg/mole of copper.

11 Claims, No Drawings

DUCTILE COPPER

FIELD OF THE INVENTION

This invention relates to ductile copper deposits, their method of manufacture and to the use of such deposits in the manufacture of printed wiring boards, and more specifically to improvements in the tensile strength, elongation and resistance to thermal stress of such deposits.

BACKGROUND OF THE INVENTION

U.S. Pat. No. 3,959,531 to Schneble et al. indicates that iron in electroless copper depositions solutions should be below 25 mg/l, preferably below 10 mg/l in order to reduce extraneous copper deposits and avoid spontaneous decomposition of the plating solution. There is no teaching in U.S. Pat. No. 3,959,531 that trace quantities of codeposited iron affect the physical properties of the electrolessly deposited copper. U.S. Pat. No. 3,485,643 to Zeblisky et al. indicates that hexacyanoferrates added to electroless copper deposition solutions in concentrations up to 300 mg iron per liter will increase the plating rate and act as stabilizers and brighteners.

U.S. Pat. No. 4,650,691 to Kinoshita et al. also describes the use of hexacyanoferrates as stabilizers for electroless copper plating baths. Kinoshita et al. report that the hexacyanoferrates decompose in the plating bath and that the decomposition products inhibit further electroless copper plating and form precipitates in the bath. Kinoshita et al. indicate that the use of triethanolamine at one to three times the molar concentration of the hexacyanoferrate in the electroless bath will prevent destruction of the bath by inhibition of the plating reaction and the formation of precipitates.

U.S. Pat. Nos. 3,615,732; 3,615,722 and 3,615,735 describe the addition of Group VIII metal salts (Fe, Co, Ni, Pt and Os) to electroless copper plating solutions in combination with other additives to obtain improved ductility. U.S. Pat. No. 3,615,735 asserts copper alloys containing 0.05 to 2.5% of the Group VIII metals would provide superior ductility. The teaching of these three patents is that traces of Group VIII metals, including iron, in the copper deposit will improve ductility and the elongation under stress. The inclusion of iron to improve the ductility of copper deposits is in direct contradiction to, and teaches away from, the present invention described hereinbelow. Review of the more than 75 different examples in these three patents finds no ductile deposit containing iron. The only ductile copper deposits are in examples where the copper deposits contained traces of nickel and/or platinum as the Groups VIII metal.

U.S. Pat. No. 4,695,505 describes ductile, electrolessly deposited copper containing 74 to 280 ppm nickel. The elongation of 38 $\mu$m (1.5 mil) thick copper was 11-15%. The copper plating baths contained 45-446 mg/l of nickel ions. The electroless plating bath cited had four stabilizers including potassium ferrocyanide. The potassium ferrocyanide concentrations were 60-1000 mg/l (17-293 mg iron/liter). The ductile copper deposits described in the example were obtained by discarding the plating solution every hour and replacing it with a brand new solution until the deposit thickness of 38 $\mu$m was obtained. Discarding plating solutions on an hourly basis is not practical as a method of manufacturing copper deposits for printed wiring boards.

Standard Specification IPC-AM-372, ELECTROLESS COPPER FILM FOR ADDITIVE PRINTED BOARDS, The Institute for Interconnecting and Packaging Electronic Circuits, 7380 N. Lincoln Ave., Lincolnwood, Ill. 60646-1705 U.S.A. (1978) and Japanese Industrial Standard JIS H 8646 ELECTROLESS COPPER PLATINGS, Japanese Standards Association, 1-24, Akasaka 4, Minato-ku, Tokyo 107 Japan (1991) specify a copper purity of 99.2%. These specifications do not specify the trace metal concentrations in the copper deposit. They indicate only that the total trace metal (excluding silver) is below 0.8%.

There is a need in the printed wiring industry for high quality copper which will maintain reliable interconnections through the assembly process and the anticipated life of equipment containing the printed circuit. Printed wiring interconnections can fail by breaks in the copper conductive pattern caused by the stresses induced by the difference between the thermal expansion of the copper conductive pattern and the insulating substratum to which it is attached. The first set of thermal stresses occur during the assembly process when components are joined to the conductive pattern by soldering at temperatures from 200° to 300° C. In MIL 55110 D there is an attempt to address this problem by imposing a thermal stress test requirement on printed wiring boards. The thermal stress test requires the printed wiring boards to be conditioned by drying above 110° C. for six hours to remove moisture. Then soldering flux is applied to the boards and they are thermally stressed by application of molten solder at 288° C. for 10 seconds. After soldering, holes in the test board are microsectioned and examined with a low power microscope. Any evidence of a crack in the copper hole wall is considered a failure of the test. Since there may be more than one soldering cycle in the assembly of a printed circuit, some electronic equipment manufacturers have required suppliers of printed wiring boards to test the boards by repetitive thermal stress cycles at 260° or 288° C.

The second set of thermal stresses accumulate as thermal cycling occurs each time the equipment is turned on and off during use and the temperature rises from ambient temperature to the operating temperature of the equipment. Thermal cycling tests are used to simulate the cumulative effect of these stresses. A typical thermal cycling test is 30 minutes at -65° C. followed by 30 minutes at 125° C. A test board contains either 50 or 100 plated-through holes connected in series. More than 400 cycles with no open circuits and less than 10% increase in the resistance of the series of holes is considered good performance.

For subtractive printed wiring boards, the need for high quality copper has been addressed by standards for electroplated copper foils which specify the ductility and elongation for standard and high ductility copper foils, and by the development of baths and control methods for the baths for electroplating high quality copper for plated-through holes. For fully-additive and partly additive printed wiring boards, the need was not met. In spite of the need and a large number of groups working on this, no success was achieved.

SUMMARY OF THE INVENTION

It only now has been found that the codeposition of species of iron and chromium in the copper deposit can be controlled, and that controlling the level of these species in the copper deposit makes possible excellent quality, electrolessly deposited copper. The copper deposits are equivalent or superior to those provided for the electroplated foil and electroplated through holes available for subtractive printed wiring processes. The accepted standard for purity of electroplated copper is 99.8 copper, (with silver counted as copper) i.e., less than 200 ppm non-copper impurities, so that one would not have expected that working in the direction of further reducing trace metal species such as iron and chromium would have a significant impact. Surprisingly, applicants have discovered that by controlling the iron and/or chromium content in copper deposits to less than 2 mg per mole copper, excellent copper deposits may be achieved which have high resistance to thermal stress, high elongation and good tensile strength.

In its broadest aspect, the present invention comprises a method for manufacturing electrolessly deposited copper which is of high ductility with improved toughness, highly resistant to stress and characterized in that the copper deposit contains less than 2 mg/mole copper of trace metals selected from the group consisting of iron and chromium and combinations thereof.

In another aspect, the invention comprises a method of manufacturing articles having copper formed by electroless deposition from a plating bath containing a copper compound, a complexing agent for copper, a reducing agent for copper, a pH-adjusting agent, and one or more addition agents. The improvement produces a copper deposit on a printed wiring board capable of withstanding four repetitive 10 second solder floats at 288° C. without any cracks forming that are detectable at a magnification of 100×. The improvement comprises monitoring and maintaining the concentration of available iron and chromium and combinations thereof in the plating bath at a level below 125 mg per mole copper in the plating bath, and such that the content of iron and chromium and combinations thereof in the deposited copper layer is less than 2 mg per mole of copper.

In another embodiment, the invention comprises a method of manufacturing electrolessly deposited copper wherein the concentration of available iron and chromium and combinations thereof in the plating bath is monitored and maintained by monitoring the copper replenishment solution and maintaining the concentration of iron below 10 mg of available iron per mole of copper in the copper replenishment solution.

In one such embodiment, the electroless copper plating bath comprises a complexing agent for copper and a complexing agent for iron. The operating pH is monitored and maitained between 11 and 12.5 when measured at 25° C. such that the formed iron complex is tight enough to limit codeposited iron in the copper layer to less than 1.5 mg per mole copper.

In yet another embodiment, the invention comprises highly stress resistant, copper deposits formed by these methods of manufacture.

In another embodiment, the invention comprises a printed wiring board having a plated-through hole plated with electrolessly deposited copper, the copper characterized in that trace iron and/or chromium content is less than 2 mg per mole copper.

DETAILED DESCRIPTION OF THE INVENTION

This invention comprises a copper deposit formed by electroless deposition, the copper being characterized by having less that 2 mg of metallic impurities per mole copper. It has been found that, contrary to the teachings of the prior art, the tensile strength and elongation of electrolessly deposited copper is reduced by trace metal impurities in the deposit, particularly iron and chromium impurities. Preferably, the copper deposit comprises less than 2 mg iron and/or chromium per mole copper, more preferably less than 1.5 mg iron and/or chromium and, most preferably less than 0.8 mg iron and 0.5 mg chromium per mole copper.

Surprisingly, it has been found that when the electroless copper deposition solution has been operated in a manner to reduce the trace metals in the deposit, that copper deposits with increased ductility and toughness are produced. Such copper deposits, when used as the conductive pattern for fully-additive circuits or as walls of plated-through holes, provide strength to pass the most stringent thermal shock tests, such as two or more soldering cycles, each cycle of 288° C. for 10 seconds, and thermal cycle tests, such as 400 cycles, each cycle being 30 minutes at −65° C., a 30 minute transition and 30 minutes at 125° C.

Unexpectedly, it has been found that the trace iron, chromium or combined iron and chromium concentration in electrolessly deposited copper varies significantly even though the concentration of iron and chromium impurities in the electroless plating bath are essentially the same.

It has been found that limiting the trace iron content of electrolessly deposited copper to less than 1.5 mg iron per mole copper substantially improves the quality of the deposited copper by providing high elongation and resistance to thermal stress. Preferably, the trace iron content of the deposited copper should be less than 0.8 mg per mole copper. The amount of codeposited iron depends on the strength of the iron complex present in the electroless copper deposition bath.

It has been found that for electroless copper plating baths comprising ethylenediamine-tetraacetic acid (EDTA), the iron complex is not sufficiently tight at a pH exceeding 12, and that such plating baths should be operated at a pH not exceeding that value. When EDTA is the complexing agent, the optimum plating for minimum iron in electrolessly deposited copper is obtained when the plating bath has a pH of 11.2 to 12 (measured at 25° C.).

Additional complexing agents that sequester these metals preferentially can be added to the plating bath as addition agents to extend the operating range. For iron, such complexing addition agents should form a soluble complex with iron (III) at the operating temperature and pH of the plating bath. The complexing addition agent should sequester iron (III) more strongly than copper. Suitable complexing addition agents include bicine (N,N-bis(2-hydroxyethyl)glycine) which preferentially sequesters iron (III) over copper (II) up to pH 12.5 (measured at room temperature). Complexing addition agents that strongly sequester copper (II) may be utilized in plating baths where the main complexing agent for copper forms a stronger complex with copper than the complexing addition agent, so that the complexing addition agent remains free to sequester iron (III).

In general, it is difficult to maintain a low concentration of trace metal in the deposits if the trace metal concentration in the electroless copper plating bath is greater than 150 mg iron and/or 25 mg chromium per mole copper ion in the plating bath. Preferably the trace metal concentration in the electroless copper plating bath should be below 75 mg iron per mole copper and/or 13 mg chromium per mole copper ion in the plating bath.

A source of trace iron in the electroless copper bath is the copper salt used as a source of copper in the plating bath, and to replenish the plating bath and used to replace the copper electrolessly deposited. Copper sulfate is commonly selected for replenishment of electroless copper plating baths in manufacturing facilities as it is the purest copper salt commercially available. Most electroless copper plating baths are operated in a "bailout" mode in which by-product sulfate in the plating bath is controlled by discarding a portion of the plating bath and replacing the discarded portion with an equal volume of fresh, by-product free solution. The concentration of the iron in the electroless copper plating bath will depend on the iron concentration, mg Fe/mol Cu, in the copper sulfate replenishment solution, and will be approximately equal to the mg Fe/mol $SO_4^=$ in the electroless bath. If the by-product sulfate concentration is maintained at 0.25 mol/L, the copper sulfate used to replenish the electroless plating bath should have an iron concentration no higher than 10 mg iron per mole copper and preferably no higher than 5 mg per mole copper.

Sources of trace chromium in the electroless copper plating bath include: chromium containing adhesion promotion solutions used to prepare the basis material for electroless plating; chromium alloys used in stainless steel plating racks and stainless steel tanks for the electroless plating bath, and chromium corrosion inhibitors and bright dips on copper surfaces which have been etched and recycled from etching solutions as copper sulfate.

It has been discovered that iron contamination in the copper deposit can be minimized by reducing the operating pH of the electroless copper plating bath. Electroless copper plating baths having a pH of 12.8 (measured at 25° C.) form copper deposits that have high iron content and exhibit low elongation in tensile testing. When the pH (measured at 25° C.) of the plating bath is reduced to <12, the copper deposited has less than 20% of the iron found in the deposit from the same plating bath at a higher pH, and the deposit exhibits high elongation in tensile testing. While not wishing to be bound by theory, it is postulated that iron (III) hydroxide present in the plating bath is partially solubilized at the higher pH and the solubilized iron can more easily diffuse though the plating bath and the Helmholtz double layer for incorporation in the deposit.

It also is postulated that iron (II) compounds are more soluble than the iron (III) compounds and thus more easily incorporated into the deposit. The plating bath is operated to minimize the iron (II) content. The iron present in the electroless plating bath is usually present as iron (III) compounds. However, when copper is being deposited, hydrogen gas is generated at the plating surface. The hydrogen generated sweeps out dissolved oxygen, and provides a reducing atmosphere in the plating bath. Increasing use of stainless steel equipment, even plating tanks, have required electrolytic passivation of steel surfaces in contact with the plating bath. During electrolytic passivation, stainless steel tanks and other equipment exposed to the plating bath are kept at an anodic potential which is positive enough to prevent the deposition of copper on the tanks and other equipment. If the passivating film is weakened or damaged, iron and chromium may temporarily pass into the electroless copper plating bath before the passivation film is reformed. Iron compounds dissolved from the equipment at these anodic potentials are present in the plating bath as iron (II) compounds.

In one embodiment of the invention, the iron in the deposit is controlled by adjusting the passivating potential to more negative potentials even to the point where a slight amount of copper slowly grows on the steel. In another embodiment, the steel is plated with a thin layer of electroless copper before a passivating anodic potential is applied. In yet another embodiment, air spargers are placed next to the steel so that the layer of plating bath adjacent to the steel is oxygenated to a degree sufficient to convert iron (II) compounds to iron (III) compounds which are less deleterious to the copper plating.

The invention will be further described by the examples below. In the examples, the copper deposits varied in thickness. The standard tensile strength calculation included a correction for the thickness of the deposit, but the standard percent elongation did not. In the examples, the percent elongation of deposits with varying thicknesses was compared by normalizing the thicknesses to 30 μm.

Also, in the examples, the pH, formaldehyde and copper concentration and air injection and the plating bath temperatures were monitored and maintained at the stated values.

EXAMPLE 1

As a comparison to applicant's invention, an electroless copper plating bath was operated with the following formulation according to the procedures of U.S. Pat. Nos. 4,632,852 and 4,970,107:

| | | |
|---|---|---|
| $CuSO_4.5H_2O$ | g/L | 10 |
| $Na_4EDTA.2H_2O$ | g/L | 41 |
| NaOH | pH at 25° C. | 12.5 |
| Formaldehyde (37% solution) | mL/L | 2.2 |
| By-product $Na_2SO_4$ | mol/L | 0.25 |
| By-product NaOOCH | mol/L | 0.5 |
| Polyoxyethylene (MW = 1000) | g/L | 1 |
| $GeO_2$ | mg/L | 70 |
| Air injection (large bubbles) | L/min/L(bath) | 0.07 |
| Air injection (fine bubbles) | L/min/L(bath) | 0.14 |
| Temperature | °C. | 72 |

Large air bubbles came from a pipe with 0.6 mm diameter holes. Fine air bubbles came from a porous walled pipe.

The plating bath was operated with a load of 1.5 dm² of surface being plated per liter. Copper was deposited on printed wiring boards and also on a stainless steel substratum to obtain a foil suitable for tensile testing. The rate of copper deposition was 6–7 μm/hr.

The same plating bath (prepared according to the procedures of U.S. Pat. Nos. 4,632,852 and 4,970,107) was modified according to this invention. The pH of the electroless copper plating bath was lowered to 11.8 and the plating bath was operated with the following formulation:

| | | |
|---|---|---|
| CuSO$_4$.5H$_2$O | g/L | 10 |
| Na$_4$EDTA.2H$_2$O | g/L | 41 |
| NaOH | pH at 25° C. | 11.8 |
| Formaldehyde (37% solution) | mL/L | 3.8 |
| By-product Na$_2$SO$_4$ | mol/L | 0.25 |
| By-product NaOOCH | mol/L | 0.5 |
| Polyoxyethylene (MW = 1000) | g/L | 1 |
| GeO$_2$ | mg/L | 70 |
| Air injection (large bubbles) | L/min/L(bath) | 0.07 |
| Air injection (fine bubbles) | L/min/L(bath) | 0.07 |
| Temperature | °C. | 72 |

The plating bath was operated with a load of 1.5 dm$^2$ of surface being plated per liter. Copper also was deposited on a stainless steel substratum to obtain a foil suitable for tensile testing. The rate of copper deposition was 6–7 μm/hr.

The plating bath was operated for two more days at pH 11.8 measured at 25° C.

After each day, the copper deposited on the stainless steel substratum was dried for 1 hour at 160° C. After drying, a copper foil was removed from the stainless steel. A portion of the foil was used for tensile testing, and a portion was analyzed for the trace iron content. The results comparing the same plating bath operated at a pH of 12.5 (U.S. Pat. Nos. 4,632,852 and 4,970,107) and a plating bath operated at a pH of 11.8 (a bath pH within applicant's invention) are reported in Table 1. The percent elongation is reported as measured at the deposit thickness and as normalized to a thickness of 30 μm.

TABLE 1

| Bath pH at 25° C. | Iron Conc. in the Copper mg/mol | Tensile Strength MPa | Deposit Thickness μm | % Elongation As Measured | % Elongation Normalized to 30 μm |
|---|---|---|---|---|---|
| 12.5 | 3.50 | 331 | 49.5 | 2 | 2 |
| 11.8 | 0.53 | 413 | 27.2 | 6 | 7 |
| 11.8 | 0.54 | 400 | 29.2 | 8 | 8 |
| 11.8 | 0.53 | 455 | 30.5 | 9 | 9 |

These results demonstrate that the iron content of the deposit was controlled by controlling the bath pH, and the percent elongation of the deposit increased when the iron content was controlled.

EXAMPLE 2

An electroless copper plating bath was operated with the following formulation and replenished with a copper sulfate solution containing 2 mg iron per mole copper sulfate.

| | | |
|---|---|---|
| CuSO$_4$.5H$_2$O | g/L | 10 |
| Na$_4$EDTA.2H$_2$O | g/L | 41 |
| NaOH | pH at 25° C. | 11.8 |
| Formaldehyde (37% solution) | mL/L | 4.3 |
| By-product Na$_2$SO$_4$ | mol/L | 0.25 |
| Fe | mg/L | 0.7 |
| By-product NaOOCH | mol/L | 0.5 |
| Polyoxyethylene (MW = 1000) | g/L | 1 |
| GeO$_2$ | mg/L | 70 |
| V$_2$O$_5$ | mg/L | 2 |
| Air injection (large bubbles) | L/min/L(bath) | 0.07 |
| Air injection (fine bubbles) | L/min/L(bath) | 0.07 |
| Temperature | °C. | 72 |

The plating bath was operated with a load of 1.5 dm$^2$ of surface being plated per liter. The rate of copper deposition was 4.5–5.5 μm/hr. The 26 μm copper foil deposited on the stainless steel substratum was dried for 1 hour at 160° C. A tensile test was performed on the foil. The tensile strength was 345 MPa and the elongation was 18% (20% when normalized to 30 μm thick deposit). A sample of the copper foil was analyzed and the iron content was found to be 0.34 mg/mol.

COMPARATIVE EXAMPLE

Example 2 was repeated except that the electroless copper plating bath had a high trace iron content from replenishment with copper sulfate solution contaminated with 32 mg iron per mole of copper sulfate. The results of tensile testing of the copper deposited are shown in Table 2.

TABLE 2

| Plating Run | Deposit Thickness μm | Tensile Strength MPa | % Elongation As Measured | % Elongation Normalized to 30 μm | Iron in Copper Foil ppm |
|---|---|---|---|---|---|
| 1 | 23 | 455 ± 7 | 6 ± 1 | 7 | 205 |
| 2 | 29 | 434 ± 1 | 6 ± 1 | 6 | 62 |

This demonstrates that when the trace iron in the plating bath is high, even operating the electroless copper plating bath at a pH between 11.3 and 12.0 is not sufficient to maintain low iron in the deposit and the deposits obtained will have lower ductility.

EXAMPLE 3

Example 2 is repeated using the copper sulfate replenishment solution containing 32 mg iron per mole copper sulfate, but the electroless copper plating bath is modified by an iron complexing addition agent. The complexing addition agent is bicene. Five grams of bicene is added to each liter of the copper sulfate replenishment solution. Copper is electrolessly plated from the bath; the copper has high thermal shock resistance and less than 1.5 mg iron per mole of copper.

EXAMPLE 4

Passivated stainless steel tanks are used for large volume, electroless copper plating because large plastic tanks have a short useful life at high temperatures used for additive plating. An anodic potential is imposed on the tank to prevent copper deposition on the stainless steel walls. In order to evaluate the effect of a passivated stainless steel tank on the trace metals included in the electroless copper deposit, fully-additive printed wiring boards were plated with electroless copper in a electrochemically passivated stainless steel tank. The printed wiring boards were plated in a 330L stainless steel tank which was passivated by a constant voltage power supply at 1 volt.

The electroless copper plating bath was operated with the following formulation:

| | | |
|---|---|---|
| CuSO$_4$.5H$_2$O | g/L | 6.8 |
| Na$_4$EDTA.2H$_2$O | g/L | 28 |
| NaOH | pH at 25° C. | 11.7 |
| Formaldehyde (37% solution) | mL/L | 3.4 |
| By-product Na$_2$SO$_4$ | mol/L | 0.25 |
| By-product NaOOCH | mol/L | 0.5 |
| Maleic acid | g/L | 1.0 |
| Tartaric acid | g/L | 1.0 |
| NaCN (Orian ™ Cyanide Ion Electrode) | mV vs SCE | 120 |
| V$_2$O$_5$ | mg/L | 1.2 |
| Surfactant (Klearfac AA-270 ™) | mg/L | 45 |

| | -continued | |
|---|---|---|
| Air injection (large bubbles) | L/L(bath)/min | 0.07 |
| Temperature | °C. | 82 |

The air was not injected into the electroless copper deposition tank; it was injected into the circulation system to prevent electroless copper plating in the pipeline and the pump. The injected air escaped from the bath as the plating bath left the exterior circulation system and reentered the tank. The plating bath in the tank was saturated with hydrogen generated by the plating reaction.

The electroless copper plating bath was used to deposit copper on adhesive coated, epoxy resin impregnated, glass cloth (FR-4) laminate to make fully additive printed wiring boards with plated-through holes. The FR-4 laminate was 1.6 mm thick, and the diameter of the holes were 0.8 to 1.1 mm. The plating bath was operated with a load of 4 dm$^2$ of surface being plated per liter. The rate of copper deposition was 2.2 μm/hr, and the additive printed wiring boards were plated for 17 hours. The copper deposited from the plating bath was analyzed for trace iron and trace chromium contamination.

The strength and ductility of the copper was evaluated by a thermal stress test. The thermal stress test was performed on a sample having plated-through holes cut from the copper plated printed wiring board. The test consisted of: a) drying the sample for 6 hours at 150° C.; b) floating the sample on a molten solder bath at 288° C. for 10 seconds five times, cooling to room temperature between each solder float; c) microsectioning 13 plated-through holes; and d) examining the plated-through holes for cracks in the copper deposit using a microscope with 400× magnification. A measurement system was specified to quantify the cracks in the plated-through holes. When cracks occurred, they occurred in the copper at the intersection of the hole wall with the laminate surface.

Four intersections (corners) were examined in each plated-through hole. A value of 0, 1, 2, or 8 was assigned to each corner. A value of 0 corresponded to no crack; a value of 1 to a partial crack extending through less than 50% of the thickness of the copper deposit; a value of 2 to a hairline crack extending 50-100% through the copper thickness, and value of 8 to an open break extending completely through the copper which became filled with solder during the solder float.

In this test a crack rating of less than 15 means a tough, ductile, copper deposit in which the thirteen holes inspected had, on average, only one small partial crack after five thermal stress cycles. These small cracks are not observable at 100×, but are found only at 400× magnification.

A crack rating of 25 indicates a copper deposit that is intact after five thermal stress cycles, but has been strained sufficiently to form hairline cracks extending more than 50% through the copper deposit at one point or smaller, partial cracks extending around the rim of the hole. Such cracks are not observed at 100× magnification.

A crack rating greater than 50 indicates cracks which also are observable at 100× and which are greater than 50% through the deposit and extending around the rim of the hole. This indicates that the copper deposit did not have sufficient strength and ductility to permit the plated-through holes to survive five thermal stress cycles.

The tough copper deposit will have a crack rating less than 35 by this five cycle thermal stress test, a tougher deposit will have a crack rating less than 25, and the highest quality deposits will have crack ratings of 0-15.

The results of the thermal stress test are shown in Table 3.

TABLE 3

| Fe in Plating Run | Cr in Copper Deposit mg/mol | Copper Deposit mg/mol | Crack Rating |
|---|---|---|---|
| 1 | 2.2 | 13.2 | 280 |
| 2 | 7.3 | 1.3 | 389 |
| 3 | 7.1 | 5.0 | 416 |
| 4 | 9.6 | 4.1 | 416 |
| 5 | 0.4 | 0.6 | 307 |
| 6 | 1.6 | 0.5 | 117 |
| 7 | 0.13 | 0.13 | 13 |
| 8 | 0.4 | 0.4 | 35 |

In all plating runs, the passivation voltage prevented copper deposition on the stainless steel tank. However, a passivation film which also would prevent incorporation of iron and chromium in the copper deposit only started to form in plating run 5, weakened in plating runs 6 and 8. In plating run 7, the passivation film not only prevented copper deposition on the stainless steel tank, but also prevented the incorporation of iron and chromium from the anodic tank walls into the electroless copper deposits. These results demonstrate the poor ductility and low strength of electroless copper deposits containing more than 1.5 mg iron and/or 0.4 mg chromium per mole copper.

EXAMPLE 5

To demonstrate that the trace chromium and iron caused the failure of the plated-through holes, Example 3 was repeated except that the anodic passivation voltage was switched off. This permitted the stainless steel tank to plate with copper, but prevented the incorporation of anodically generated iron and chromium from the stainless steel into the copper deposits. The results are shown in Table 4.

TABLE 4

| Plating Run | Tensile Strength MPa | % Elongation | Fe in Copper Deposit mg/mol | Cr in Copper Deposit mg/mol | Crack Rating |
|---|---|---|---|---|---|
| 1 | 350 | 11.4 | <0.01 | 0.05 | 29 |
| 2 | 354 | 9.6 | <0.01 | 0.03 | 26 |
| 3 | 368 | 7.7 | <0.01 | 0.03 | 21 |
| 4 | 345 | 6.1 | <0.01 | 0.07 | 25 |
| 5 | — | — | — | — | 24 |
| 6 | — | — | <0.01 | <0.01 | 25 |

This demonstrates a remarkable increase in the resistance to thermal stress of the electroless copper was achieved by reducing the trace metal content of the copper deposit.

EXAMPLE 6

An electroless copper plating bath was operated in a polypropylene plating tank with an anodically passivated stainless steel panel in the bath to simulate a passivated stainless steel tank. A potential of 1 volt was maintained between the counter electrode and the anodically passivated stainless steel panel. The electroless copper plating bath was operated with the following formulation:

| CuSO₄.5H₂O | g/L | 7.8 |
|---|---|---|
| Na₄EDTA.2H₂O | g/L | 38 |
| NaOH | pH at 25° C. | 11.8 |
| Formaldehyde (37% solution) | mL/L | 3.8 |
| By-product Na₂SO₄ | mol/L | 0.25 |
| By-product NaOOCH | mol/L | 0.5 |
| Maleic acid | g/L | 0.4 |
| Tartaric acid | g/L | 0.4 |
| NaCN (Orian ™ Cyanide Ion Electrode) | mV vs SCE | 107 |
| V₂O₅ | mg/L | 5 |
| Surfactant (Gafac RE 610 ™) | mg/L | 45 |
| Air injection (large bubbles) | L/L(bath)/min | 0.07 |
| Temperature | °C. | 72 |

The air was not injected into the electroless copper plating tank; it was injected into the circulation system to prevent electroless copper deposition in the pipeline and the pump. The injected air escaped from the bath as the plating bath left the exterior circulation system and reentered the tank. The plating bath in the tank was saturated with hydrogen generated by the plating reaction.

The electroless copper plating bath was used to deposit copper on adhesive coated, FR-4 laminate to make fully additive printed wiring boards with plated-through holes, as in Example 3. The copper deposited from the plating bath was analyzed for trace iron and trace chromium contamination.

The strength and ductility of the copper was evaluated by the thermal stress test as in Example 4.

The results are shown in Table 5.

TABLE 5

| Plating Run | Fe in Bath mg/L | Cr in Bath mg/L | Fe in Copper Deposit mg/mol | Cr in Copper Deposit mg/mol | Crack Rating |
|---|---|---|---|---|---|
| 1 | 2.0 | — | 0.77 | 1.65 | 77 |
| 2 | 1.7 | — | 0.29 | 0.25 | 18 |
| 3 | 1.0 | 0.2 | 0.45 | 1.46 | 95 |
| 4 | 1.0 | 0.2 | 0.21 | 1.46 | 112 |
| 5 | 1.2 | — | 0.37 | 0.83 | 26 |
| 6 | 2.1 | 0.3 | <0.01 | 1.21 | 78 |
| 7 | 2.2 | 0.3 | 0.32 | 0.24 | 8 |
| 8 | 1.6 | 0.2 | <0.01 | 0.23 | 10 |
| 9 | 1.6 | 0.2 | <0.01 | 0.17 | 1 |

In all nine plating runs, the passivation voltage prevented copper deposition on the stainless steel panel. However, in plating runs 1, 3, 4 and 7 a weakness in the passivation film allowed iron and chromium to pass into the electroless plating bath. These results demonstrate the poor ductility and low strength of electroless copper deposits containing more than 0.4 mg chromium per mole copper. These results also show that even though analysis of the electroless bath indicates low levels of iron and chromium compounds, excessively high concentrations may occur in the copper deposit due to operating parameters of the bath.

Ten test runs were carried out repeating the conditions in the nine tests above except that the stainless steel panel was removed from the polypropylene plating tank, so there was no possibility of contamination of the plating bath and the deposit from breakdown of an anodic passivation layer on stainless steel. The results of this test are shown in Table 6.

TABLE 6

| Plating Run | Fe in Bath mg/L | Cr in Bath mg/L | Fe in Copper Deposit mg/mol | Cr in Copper Deposit mg/mol | Crack Rating |
|---|---|---|---|---|---|
| 10 | 1.5 | 0.3 | 0.01 | <0.01 | 11 |
| 11 | 1.8 | 0.3 | 0.01 | 0.22 | 11 |
| 12 | 1.4 | 0.2 | 0.01 | 0.18 | 18 |
| 13 | 1.5 | 0.2 | 0.01 | 0.02 | 13 |
| 14 | 1.5 | 0.2 | 0.01 | 0.01 | 12 |
| 15 | 1.4 | 0.2 | 0.09 | 0.24 | 22 |
| 16 | 1.0 | <0.1 | 0.09 | 0.07 | 9 |
| 17 | 0.9 | <0.1 | <0.01 | <0.01 | 11 |
| 18 | 0.6 | <0.1 | <0.01 | <0.01 | 14 |
| 19 | 0.7 | <0.1 | <0.01 | <0.01 | 3 |

The absence of the contamination of the deposit by iron and chromium compounds which occurred in plating runs 1, 3, 4 and 7 resulted in electroless copper with high resistance to thermal stress. The electroless copper deposits containing less than 1.5 mg iron and 0.4 mg chromium per mole copper had good strength and ductility and did not fail after five thermal stress cycles.

EXAMPLE 7

Fully-additive printed wiring boards are plated in the following electroless copper plating bath which includes bicene as an iron complexing addition agent.

| CuSO₄ 5H₂O | g/L | 10.5 |
|---|---|---|
| N,N,N',N'-Tetrakis(2-hydroxypropyl)ethylenediamine | g/L | 17.5 |
| NaOH | pH at 25° C. | 12.5 |
| Formaldehyde (37% solution) | mL/L | 3.4 |
| By-product Na₂SO₄ | mol/L | 0.25 |
| By-product NaOOCH | mol/L | 0.5 |
| Bicine | g/L | 0.25 |
| NaCN | mg/L | 30 |
| K₂S$_x$ | mg/L | 0.6 |
| Sodium 2-mercaptobenzothiazole | mg/L | 0.08 |
| Temperature | °C. | 53 |

The fully-additive printed wiring boards are manufactured having copper with less than 1.5 mg iron per mole copper. The copper demonstrates high resistance to thermal stress, having crack ratings of less than 30.

EXAMPLE 8

Fully-additive printed wiring boards are plated in the following electroless copper plating bath

| CuSO₄.5H₂O | g/L | 13.5 |
|---|---|---|
| Rochelle Salts | g/L | 20 |
| NaOH | pH at 25° C. | 12.5 |
| Formaldehyde (37% solution) | mL/L | 18.5 |
| MgSO₄.7H₂O | g/L | 1.3 |
| NiSO₄.6H₂O | g/L | 0.5 |
| Sulfamic acid | g/L | 2 |
| 2,2'-dipyridyl | mg/L | 2 |
| Air injection (large bubbles) | L/L(bath)/min | 0.08 |
| Temperature | °C. | 45 |

Five grams of bicene is added to each liter of the copper sulfate replenishment solution. The workload of surface being plated in the bath is 0.5 dm²/L. The copper electrolessly plated on the printed wiring boards is smooth and dense, and has less than 1.5 mg iron per mole of copper.

What is claimed is:

1. In a method of manufacturing electrolessly deposited copper from a plating bath containing a copper compound, a complexing agent for copper, a reducing agent for copper, a pH-adjusting agent, and one or more addition agents; the improvement for producing a copper deposit on a printed wiring board capable of withstanding four repetitive 10 second solder floats at 288° C. without any cracks forming that are detectable at a magnification of 100×, comprising monitoring and maintaining the concentration of available iron and chromium and combinations thereof in the plating bath at a level below 125 mg per mole copper in the plating bath, and such that the content of iron and chromium and combinations thereof in the deposited copper layer is less than 2 mg per mole of copper.

2. The method of claim 1, wherein the concentration of available iron and chromium and combinations thereof in the plating bath is below 75 mg iron per mole copper and/or below 13 mg chromium per mole copper in the plating bath.

3. The method of claim 1, wherein the concentration of available iron and chromium and combinations thereof in the plating bath is monitored and maintained by monitoring the copper replenishment solution and maintaining the concentration of iron below 10 mg of available iron per mole of copper in said copper replenishment solution.

4. The method of claim 2, wherein the concentration of available iron and chromium and combinations thereof in the plating bath is monitored and maintained by monitoring the copper replenishment solution and maintaining the concentration of iron below 5 mg of available iron per mole of copper in said copper replenishment solution.

5. The method of claim 1, wherein the plating bath further comprises a complexing agent for iron, said complexing agent for iron being capable of reducing the available iron in the plating bath by complexing the iron, said complexing agent for iron preferentially complexing iron over copper at a pH between 11 and 12.8, and monitoring and maintaining the operating pH between 11 and 12.5 when measured at 25° C. such that the formed iron complex is tight enough to limit codeposited iron in the copper layer to less than 1.5 mg per mole of copper.

6. The method of claim 1, wherein the plating bath is operated to deposit copper for a fully-additive printed wiring board.

7. The method of claim 2, wherein the plating bath is operated to deposit copper for fully-additive printed wiring boards.

8. The method of claim 4, wherein the plating bath is operated to deposit copper for fully-additive printed wiring boards.

9. The method of claim 5, wherein the plating bath is operated to deposit copper for fully-additive printed wiring boards.

10. The method of claim 1 wherein the copper deposit contains less than 1.2 mg iron and less than 0.8 mg chromium per mole copper.

11. The method of claim 10 wherein the copper deposit contains less than 7 mg iron and less than 0.3 mg chromium per mole copper.

* * * * *